United States Patent

Schloesser et al.

(10) Patent No.: US 9,941,403 B2
(45) Date of Patent: *Apr. 10, 2018

(54) SEMICONDUCTOR DEVICE AND METHOD FOR MANUFACTURING A SEMICONDUCTOR DEVICE

(71) Applicant: Infineon Technologies AG, Neubiberg (DE)

(72) Inventors: Till Schloesser, Munich (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/627,215

(22) Filed: Sep. 26, 2012

(65) Prior Publication Data

US 2014/0084362 A1 Mar. 27, 2014

(51) Int. Cl.
| | |
|---|---|
| H01L 29/66 | (2006.01) |
| H01L 29/78 | (2006.01) |
| H01L 29/40 | (2006.01) |
| H01L 29/423 | (2006.01) |
| H01L 27/088 | (2006.01) |
| H01L 29/06 | (2006.01) |
| H01L 21/8234 | (2006.01) |

(52) U.S. Cl.
CPC .. *H01L 29/7813* (2013.01); *H01L 21/823487* (2013.01); *H01L 27/0883* (2013.01); *H01L 29/407* (2013.01); *H01L 29/4236* (2013.01); *H01L 29/66734* (2013.01); *H01L 29/7803* (2013.01); *H01L 29/7809* (2013.01); *H01L 29/7828* (2013.01); *H01L 21/823412* (2013.01); *H01L 21/823481* (2013.01); *H01L 29/0653* (2013.01); *H01L 29/0696* (2013.01)

(58) Field of Classification Search
USPC .................................................. 257/325–335
See application file for complete search history.

(56) References Cited

U.S. PATENT DOCUMENTS

| | | | |
|---|---|---|---|
| 8,598,655 B1 * | 12/2013 | Schloesser .......... | H01L 29/7809 257/331 |
| 2008/0076222 A1 * | 3/2008 | Zundel ............... | H01L 29/7813 438/270 |
| 2008/0164516 A1 * | 7/2008 | Darwish ............ | H01L 29/0649 257/329 |
| 2011/0018004 A1 * | 1/2011 | Shimizu et al. ................ 257/77 |
| 2011/0039384 A1 * | 2/2011 | Darwish ...................... 438/270 |

(Continued)

OTHER PUBLICATIONS

Donald A. Neamen, Semiconductor Physics and Devies, Tata McGraw-Hill Publishing, 3rd Edition, p. 462-463.*

*Primary Examiner* — Trung Q Dang
*Assistant Examiner* — Frederick B Hargrove
(74) *Attorney, Agent, or Firm* — Murphy, Bilak & Homiller, PLLC

(57) ABSTRACT

A semiconductor device includes a transistor including a source region, a drain region, and a gate electrode. The gate electrode is disposed in a first trench arranged in a top surface of the semiconductor substrate. The device further includes a control electrode. The control electrode is disposed in a second trench arranged in the top surface of the semiconductor substrate. The second trench has a second shape that is different from a first shape of the first trench.

11 Claims, 9 Drawing Sheets

(56) References Cited

U.S. PATENT DOCUMENTS

| | | | |
|---|---|---|---|
| 2011/0062513 A1* | 3/2011 | Lin et al. | 257/331 |
| 2011/0136310 A1* | 6/2011 | Grivna | 438/270 |
| 2012/0061753 A1* | 3/2012 | Nishiwaki | 257/331 |
| 2012/0175635 A1* | 7/2012 | Weis | H01L 27/0207 257/77 |

* cited by examiner

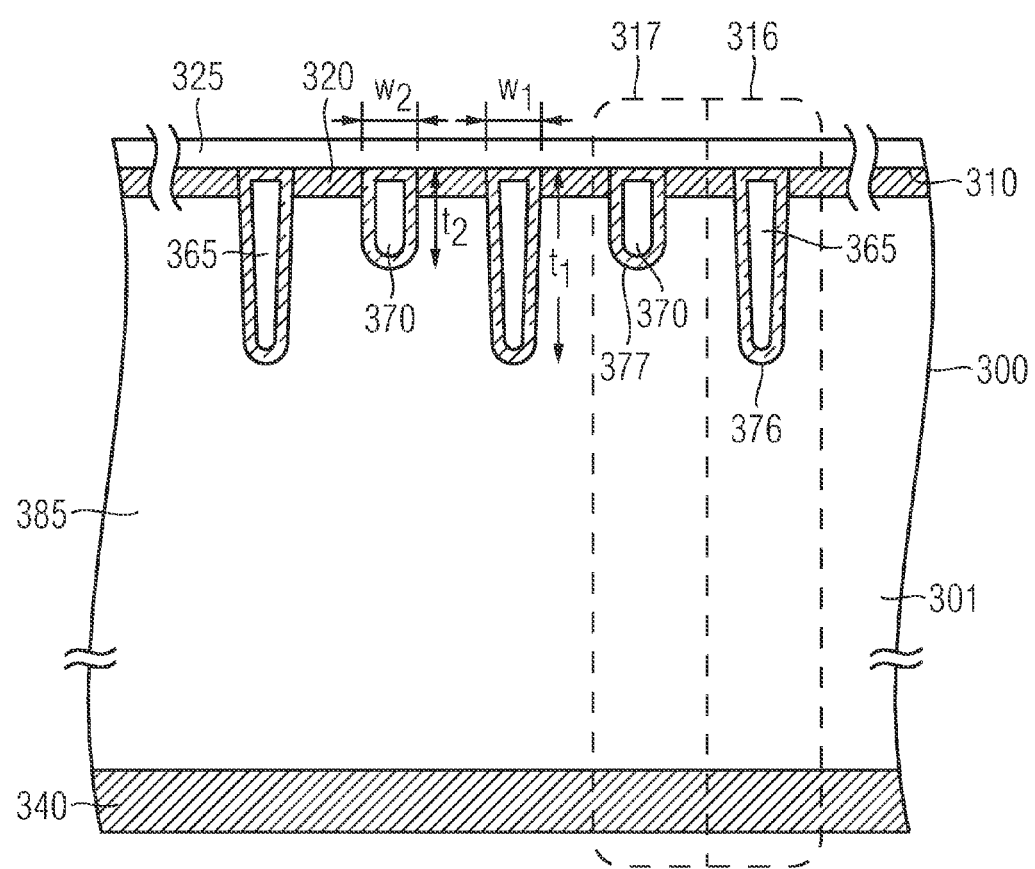

SEMICONDUCTOR DEVICE AND METHOD FOR MANUFACTURING A SEMICONDUCTOR DEVICE

TECHNICAL FIELD

The present disclosure relates to a semiconductor device and to a method for manufacturing such a semiconductor device.

BACKGROUND

Power MOSFETs (metal oxide semiconductor field effect transistor) are examples of high breakdown voltage semiconductor devices which are used for switching power sources, inverter devices or the like. For example, power MOSFETs are considered to switch high voltages at low-ohmic loads so as to have a very small switching and conduction loss. Power MOSFETs having a small on-resistance ($R_{on}$) and a high breakdown voltage when being switched off are desirable. For example, a power MOSFET should withstand a drain to source voltage $V_{ds}$ of some tens to some hundreds volts when being switched off. As a further example, power MOSFETs conduct a very large current which may be up to some hundreds of amperes at a gate-source voltage of about 10 to 20 V at a low voltage drop $V_{ds}$.

Semiconductor devices having improved transistor characteristics are being searched for. In particular, it is desirable to provide semiconductor devices having increased current efficiency (Ron×A), a steeper sub-threshold slope, a better control of the channel and lower leakage currents. Further, it is desirable to provide a simple process for manufacturing such a semiconductor device.

SUMMARY

According to an embodiment, a semiconductor device comprises a transistor including a source region, a drain region, a gate electrode, the gate electrode being disposed in a first trench arranged in a top surface of a semiconductor substrate, and a control electrode, the control electrode being disposed in a second trench arranged in the top surface of the semiconductor substrate, the second trench having a second shape that is different from a first shape of the first trench.

According to an embodiment, semiconductor device comprises a plurality of transistor cells, each of the transistor cells including a source region, a drain region, and a gate electrode disposed in a trench that is arranged in a top surface of a semiconductor substrate, the gate electrodes of different transistor cells being electrically coupled to each other, the source regions of different transistor cells being electrically coupled to each other, and the drain regions of different transistor cells being electrically coupled to each other, wherein the following formula is fulfilled for a lateral distance d between the trenches:

$d \leq 2*Wm$, wherein Wm denotes a maximum width of a surface depletion region formed in the semiconductor substrate adjacent to the gate electrodes.

According to an embodiment, a method of manufacturing a semiconductor device comprises forming a transistor by forming a source region, a drain region, a gate electrode, forming the gate electrode by forming a first trench in a top surface of the semiconductor substrate, and forming a control electrode, forming the control electrode comprising forming a second trench in the top surface of the semiconductor substrate.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 3A and 3B show cross-sectional views of a semiconductor device according to further embodiments, respectively;

DETAILED DESCRIPTION

Figure 1A:
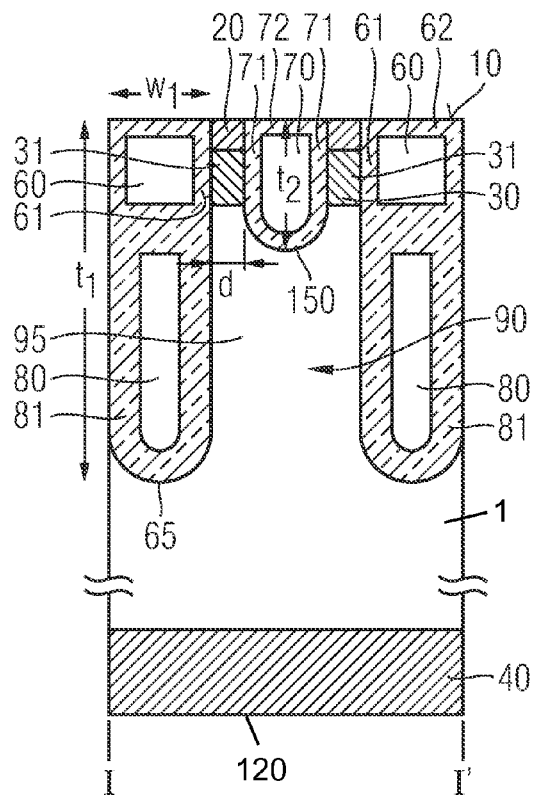
FIG. 1A shows a cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

FIG. 1A shows a cross-sectional view of an example of a semiconductor device 90. The semiconductor device 90 comprises a transistor including a source region 20, a drain region 40 and a gate electrode 60. The gate electrode 60 is disposed in a first trench 65 that is arranged in a top surface 10 of a semiconductor substrate 1, the gate electrode 60 being insulated from the adjacent body region 30 by a gate dielectric material 61. The semiconductor device 90 further comprises a control electrode 70, the control electrode 70 being disposed in a second trench 150 that is arranged in the surface 10 of the semiconductor substrate 1. The drain region 40 is disposed on a back side 120 of the semiconductor substrate 1. The source region 20 is disposed adjacent to the top surface 10 of the semiconductor substrate 1.

The first trench 65 has a first shape, and the second trench 150 has a second shape, the second shape being different from the first shape. For example, the depth t1 of the first trench 65 may be larger than the depth t2 of the second trench 150, the first and second depths being measured perpendicularly with respect to the top surface 10 of the semiconductor substrate 1. Alternatively or additionally, the width w1 of the first trench 65 may be different from the width w2 of the second trench 150. The difference between the first shape of the first trench 65 and the second shape of the second trench 150 is not due to deviations that may be caused by the trench manufacture which relates to an unintended deviation. Rather, this difference is caused by different manufacturing conditions that are employed for the first and second trenches 65, 150.

The further control electrode 70 may be connected with the gate electrode 60 or may be held at a different potential. For example, the further control electrode 70 may be grounded. The further control electrode 70 is insulated from the adjacent semiconductor material by means of an insulating layer 71.

When being switched on, for example, by applying a positive gate voltage, an inversion layer is formed at the boundary between the body region 30 and the gate dielectric material 61. Accordingly, a conductive channel 31 is formed at this boundary. Hence, the transistor is in a conducting state from the source region 20 to the drain region 40 via a drift zone 95. In case of switching off, no inversion layer is formed and the transistor is not in a conductive state. When the transistor is in a conductive state, further, a depletion layer is formed in the body region 30 adjacent to the inversion layer. For example, the width of the body region 30 may be chosen such that, when a gate voltage corresponding to the threshold voltage of the transistor is applied, the depletion layers that are formed near the boundary to the gate electrode 60 and that are formed near the boundary to the control electrode 70 are in contact with each other.

As a result, the body region 30 may be fully depleted, when a gate voltage corresponding to the threshold voltage is applied. Further, a higher current efficiency may be provided due to two adjacent conductive channels. For example, the channels may interact with each other and thus may result in a so-called "bulk inversion" which will further increase the performance. Thereby, an increased product of Ron×A is achieved. It has been demonstrated that this effect is remarkable for lower voltage classes, for example, when the semiconductor device 90 is operated at a voltage of 30 V, 40 V or 50 V. Further, the electrostatic control of the channel 31 is further improved. Thereby, undesirable short-channel effects may be avoided. As a consequence, the channel 31 may be made shorter whereby the Ron may be further decreased and the gate capacitance may be decreased. Further, it has been shown that the sub-threshold slope of the current-voltage characteristics can be improved and can be approximately made independent from the thickness of the gate oxide layer 61.

The semiconductor device 90 has lower leakage current at higher temperatures (>150° C.). In order to achieve the same threshold voltage, the doping concentration within the body region 30 should be higher than in conventional devices. Accordingly the current gain of the parasitic bipolar transistor is lower, leading to a higher robustness of the device 90 against parasitic bipolar action. Moreover, the threshold temperature may be specified to be higher.

According to an embodiment, a field plate 80 may be disposed within the gate trench 65. The field plate 80 may be disposed beneath the gate electrode 60 and may be insulated from the gate electrode 60. Further, the field plate 80 may be insulated from the drift zone 95 by an insulating layer 81. In the arrangement shown in FIG. 1A, each of the field plates 80 is disposed beneath each of the gate electrodes 60 within the gate trenches 65, whereas no field plate 80 is disposed beneath the further control electrode 70.

According to an embodiment, the pitch between adjacent field plates 80 is larger than the distance between a gate electrode 60 and an adjacent control electrode 70. Generally, the thickness of the insulating layer 81 is larger than the thickness of the gate dielectric material 61. According to an embodiment, the field plate 80 has a geometry or dimensions that are different from the geometry or dimensions of the gate electrode 60. According to an embodiment, the field plates 80 may be electrically coupled to the gate electrodes 60 in the same trench 65. According to the embodiment shown in FIG. 1A the field plate 80 is disposed beneath each of the gate electrodes 60 and no field plate is disposed beneath the control electrode 70. In other words, the field plate 80 is disposed in each of the first trenches 65. According to a further embodiment, the field plate 80 may be arranged in every n-nth first trench 65, wherein n is equal to or greater than 2, for example, every $2^{nd}$, $3^{rd}$, $4^{th}$ or $5^{th}$ first trench 65.

In the arrangement shown in FIG. 1A, the further control electrodes 70 are disposed in a trench 150 that extends to a greater depth than the lower side of each of the gate electrodes 60. Also, the further control electrode 70 extends to a depth that is deeper than the lower side of the gate electrode 60. The lower side of the field plate 80 may be disposed beneath the lower side of the gate electrode 60. The gate trench 65 may extend to a greater depth than the trench 150 of the control electrode 70.

According to an embodiment, the transistor may be implemented as a superjunction transistor or superjunction device. For example, a plurality of columns of differently doped portions may be arranged in the drift zone, and the columns may extend along the direction of the drift zone. In such a superjunction or compensation device, higher doping concentrations may be employed. Accordingly, when the transistor is in an on-state, additional carriers are present due to the higher doping concentrations that may be employed, thus resulting in a decreased on-resistance. When the transistor is in an off-state, these carriers are locally compensated by carriers of the reverse conduction type, so that a high breakdown voltage is achieved.

According to a different embodiment, the width d of the semiconductor material between the insulating material 61 adjacent to the gate electrode 60 and the insulating material 71 adjacent to the further electrode 70 is much shorter than the depth t1 of the gate electrode 60 or the depth t2 of the further control electrode 70. According to this interpretation, the width d of the semiconductor material refers to the shortest width measured between the gate electrode 60 and the further control electrode 70 in the semiconductor body region 30. Further, at the threshold voltage of the transistor, the semiconductor material of the channel 31 between the gate electrode 60 and the further control electrode 70 is completely depleted. In other words, the lateral distance between the first and second trenches 65, 150 is less than two times the width of the depletion zone at an interface between the gate electrode 60 and the adjacent substrate material, when a gate voltage corresponding to the threshold voltage is applied to the gate electrode 60. The following formula is satisfied:

$$d \leq 2 * Wm,$$

wherein Wm denotes a maximum width of a surface depletion region formed in the semiconductor substrate 1 adjacent to the gate electrodes 60. Generally, Wm is given by the following formula:

$$Wm = \sqrt{\frac{4\varepsilon_s kT \ln(N_A/n_i)}{q^2 N_A}},$$

wherein $\varepsilon_s$ denotes the permittivity of the semiconductor material (11.9 *$\varepsilon_0$ for silicon), k denotes the Boltzmann constant ($1.38066*10^{-23}$ J/K), T denotes the temperature, ln denotes the natural logarithm, $N_A$ denotes the impurity concentration of the semiconductor body 30, $n_i$ denotes the intrinsic carrier concentration ($1.45*10^{10}$ for silicon at 27° C.), and q denotes the elementary charge ($1.6*10^{-19}$ C).

Generally, it is assumed that the width of the depletion zone at a gate voltage corresponding to the threshold voltage corresponds to the maximum width of the depletion zone. For example, the width of the semiconductor material between adjacent first and second trenches 65, 150 may be approximately 20 to 130 nm, for example, 40 to 120 nm along the top surface 10 of the semiconductor substrate 1.

Conventionally, the distance or pitch between neighboring gate trenches 65 including a field plate 80 has been determined by parameters that have been set for optimizing the functionality of the field plates 80. Incorporating a control electrode 70 that is disposed in a second trench 150 having a shape that is different from the shape of the first trench 65 of the gate electrode 60, makes it possible to introduce an additional channel region. As a consequence, the distance between control electrode 70 and the gate electrode 60 can be reduced in comparison to the distance between conventional gate electrodes. Further, the number of channel regions per area can be increased. According to embodiments, two channel regions per field plate 80 (and hence the corresponding area) can be provided.

The gate electrode 60 is disposed in a trench 65 that extends in a direction perpendicular with respect to the depicted plane of the drawing. In a similar manner, the second trenches 150 may extend in the direction perpendicular to the depicted plane of the drawing. According to an embodiment, the second trenches 150 may be segmented in a direction that is perpendicular with respect to this depicted plane of the drawing. Accordingly, further channels may be formed at the interface of the insulating material 71 and the adjacent semiconductor material.

In the example illustrated in FIG. 1A, the substrate 1 is n-doped, and the source and drain regions 20, 40 are also n-doped. The doping concentration of the source and drain regions 20, 40 may be higher than that of the substrate 1. The channel 31 is p-doped.

Figure 1B:
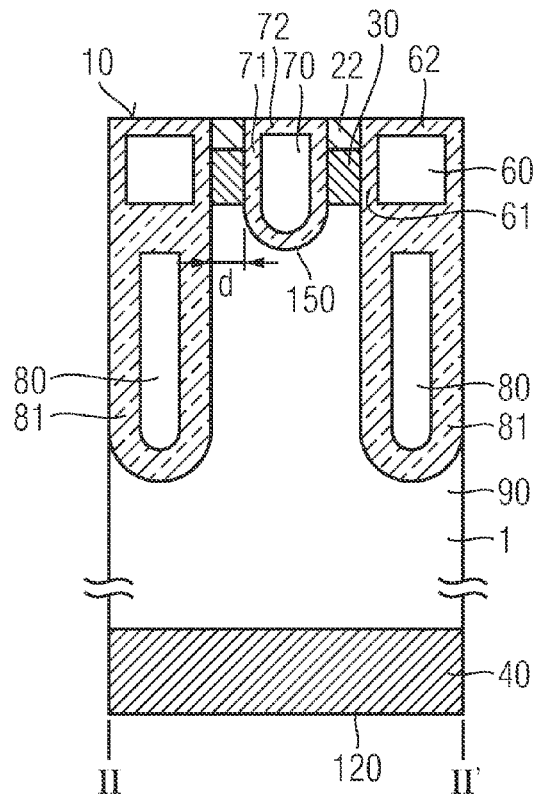
FIG. 1B is a different cross-sectional view of the semiconductor device according to an embodiment.

FIG. 1B shows a cross-sectional view of a semiconductor device in which body contacts 22 are formed so as to be in contact with the body region 30. The body contacts 22 comprise doped portions of a conductivity type which is different from the conductivity type of the source portion 20. Due to the presence of the body contacts 22, the body region 30 may be connected with a source potential so as to suppress parasitic bipolar effects which may be caused due to impact ionization when the transistor is set to an off-state. In particular, when the transistor is in an off-state, holes are subtracted from the transistor.

Figure 1C:
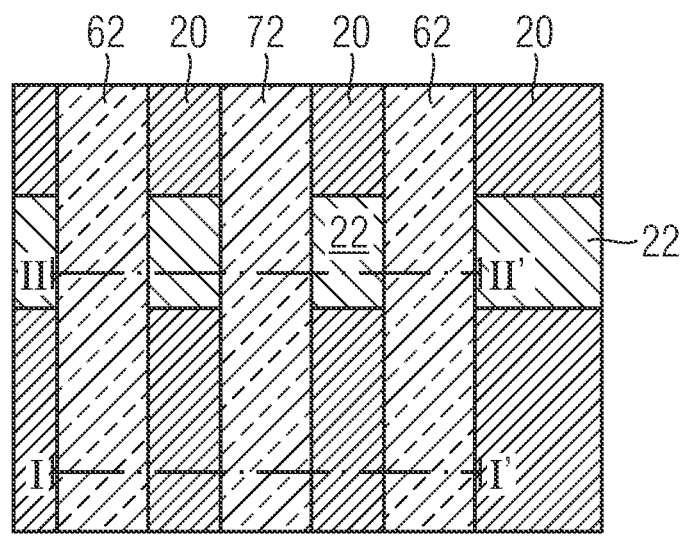
FIG. 1C shows a plan view of a semiconductor device according to an embodiment.

FIG. 1C shows a plan view of the semiconductor device. As is shown, the body contacts 22 are formed as stripes intersecting top oxide layers 62, 72. The cross-sectional view of FIG. 1A is taken between I and I', whereas the cross-sectional view of FIG. 1B is taken between II and II'.

According to a further embodiment, this kind of a semiconductor device may be implemented in a so-called "active drift zone" FET in which a plurality of second transistors that are connected in series is connected in series with a first transistor. In this case, the on-current at a gate-voltage of 0 V is improved, so that improved characteristics are shown.

Figure 2:
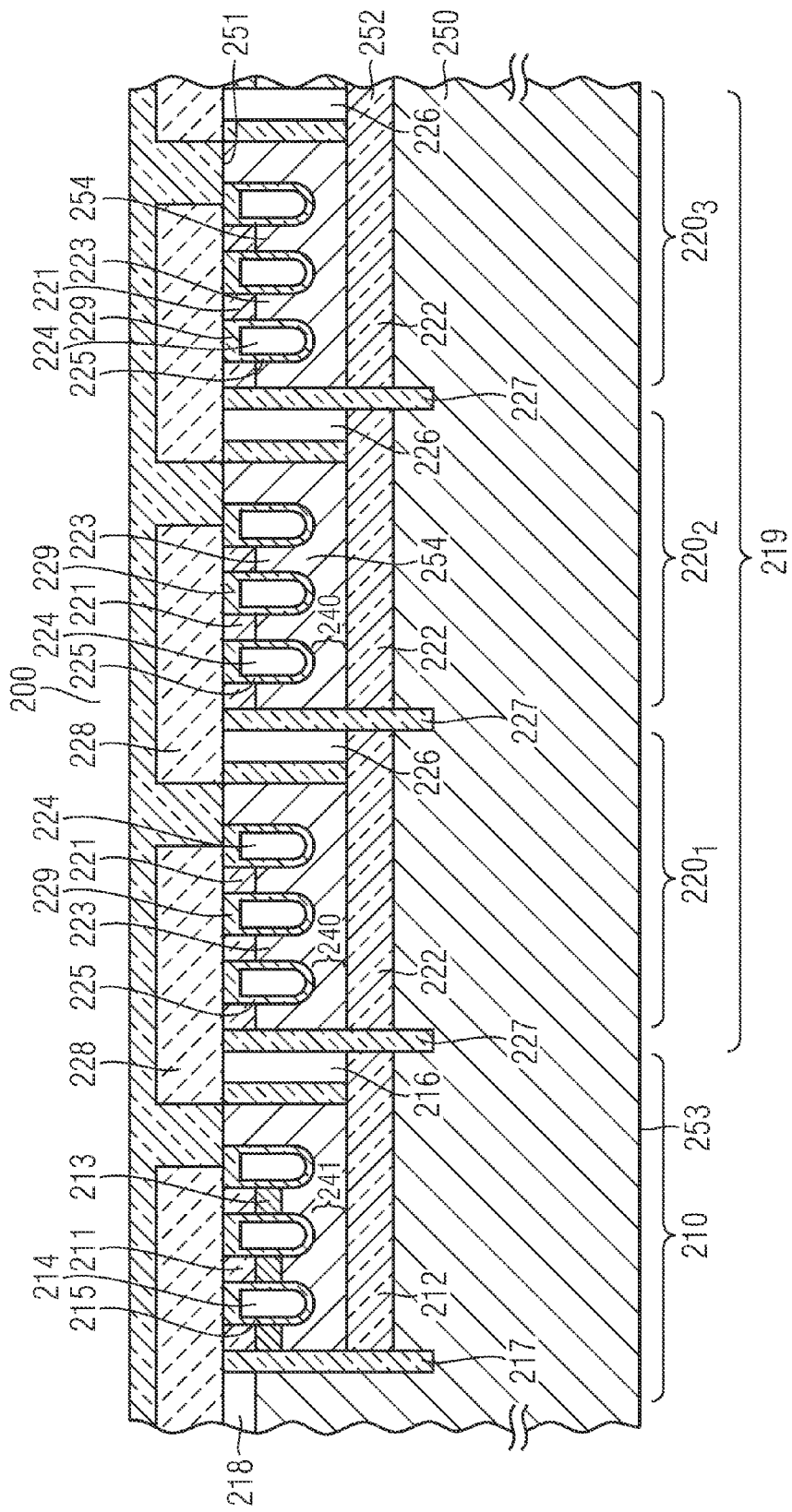
FIG. 2 shows a cross-sectional view of a semiconductor device according to a further embodiment.

FIG. 2 shows a cross-sectional view of a semiconductor device 200 implementing an ADZFET ("active drift zone FET"). The semiconductor device 200 comprises a first transistor 210 and a plurality of second transistors $220_1$ to $220_n$, each second transistor 220 having a source region 221, a drain region 222 and a gate electrode 224. The second transistors $220_1$ to $220_n$ are coupled in series to form a series circuit. According to an embodiment, the series of transistors $220_1$ to $220_n$ acts as a drift zone 219 of the first transistor 210. According to this embodiment, a drift zone 219 extends along a horizontal surface 251 of a semiconductor substrate 250. The first transistor 210 and the plurality of second transistors $220_1$ to $220_n$ are at least partially disposed in the semiconductor substrate 250 comprising a buried doped layer 252. The source region 221 or the drain region 222 of each of the second transistors 220 is disposed in the buried layer 252. Since the series of second transistors $220_1$ to $220_n$ acts as the drift zone 219 of the first transistor 210, and the second transistors 220 can be controlled by each of the respective gate electrodes 224, the semiconductor device 200 is also referred to an "active drift zone field effect transistor (ADZFET)".

The first transistor 210 and the plurality of second transistors $220_1$ to $220_n$ are disposed adjacent to the substrate surface 251. The channel 213 of the first transistor 210 as well as the channels 223 of the second transistors 220 extend in a first direction that intersects the horizontal surface 251 of the semiconductor substrate 250. For example, the channels 213 and 223 may be perpendicular to the horizontal surface 251 of the semiconductor substrate 250. The gate electrode 224 of the second transistors 220 is disposed in a gate groove that may extend perpendicularly with respect to the semiconductor substrate 251. The first transistor 210 and the plurality of second transistors $220_1$ to $220_n$ are insulated from each other by a first isolation trench 217 and a plurality of second isolation trenches 227. The first isolation trench 217 and the plurality of second isolation trenches 227 are filled with an insulating material. The first and second isolation trenches 217, 227 extend to a depth beneath the buried layer 252. For example, the first and second isolation trenches 217, 227 may extend in a depth direction of the substrate 250.

The embodiment of FIG. 2 shows an arrangement according to which each of the first and second transistors 210, 220 is implemented by three transistor cells that are connected in parallel. The transistors of each transistor cell may have a common gate electrode. Further, the source portions 221 are electrically coupled by the transistor interconnects 228. As is to be clearly understood, each of the first and second transistors 210, 220 may comprise an arbitrary number of transistor cells, and the number may be different for the first and second transistors 210, 220. According to an embodiment, the distance between the gate electrodes corresponding to different transistor cells forming any of the first and second transistors 210, 220 may be chosen such that the body region between the adjacent gate electrodes is fully depleted when a gate voltage corresponding to the threshold voltage is applied. Accordingly, the distance between the gate electrodes of different transistor cells is equal to or less than 2×(the width of the depletion zone formed in the body region 295 adjacent to the gate electrode when a gate voltage corresponding to the threshold voltage is applied). According to this embodiment, the gate electrode of an adjacent transistor cell acts as the control electrode.

In the embodiment shown in FIG. 2, the first drain portion 212 is connected with the source portion 221 of the second transistor $220_1$ disposed on the left hand side of the second transistor arrangement by means of a first contact trench 216 and the transistor interconnect 228. Moreover, the drain region 222 of the transistor $220_1$ disposed on the left hand side of the second transistors is connected with the source portion 221 of the next transistor by means of the second contact trench 226 and the transistor interconnect 228. In other words, the second transistors are connected in series, the contact between adjacent transistors being accomplished by a second contact trench 226 and the transistor interconnects 228. The transistor interconnects 228 may be implemented by segments of a conductive layer that is disposed over the first surface 251 of the semiconductor substrate 250.

The second contact trench 226 contacts the buried layer 252 in which the first and second drain regions 212, 222 are disposed. For example, the first contact trench 216 may be disposed adjacent to a first drift zone 241 of the first transistor 210. The second contact trench 226 may be disposed adjacent to a second drift zone 240 of the second transistor 220. Further, the first contact trench 216 may be disposed adjacent to the first isolation trench 217. The second contact trench 226 may be disposed adjacent to the second isolation trench 227. According to this arrangement, the contact trenches 216, 226 are insulated from adjacent drift zones, and the processing of the contact trenches 216, 226 and the isolation trenches 217, 227 can be further simplified.

The source region 211 of the first transistor 210 is connected with the substrate 250 by means of the transistor interconnect 228 and the substrate contact 218.

For example, the first transistor 210 may be implemented as a so-called enhancement FET that has a first channel 213 having a doping type which is different from the doping type of the first and second drain portions 211, 212. The enhancement field effect transistor has a positive threshold voltage in case of an n-channel FET, or a negative threshold voltage in case of a p-channel FET. The enhancement field effect transistor is set to an off-state at a zero gate voltage. Moreover, the second transistors 220 may be implemented as depletion field effect transistors which means that the second transistors 220 have a threshold voltage below 0 V in case of an n-channel FET, or above 0 V in case of a p-channel FET. The depletion field effect transistor is set to an on-state at a zero gate voltage. The channel 223 is doped with the same doping type as the second source and drain portions 221, 222.

In the example illustrated in FIG. 2 the substrate 250 is p-doped, and the source regions 211, 221 and the drain regions 212, 222 are n-doped. For example, the drain regions 212, 222, may be implemented by an $n^+$-doped buried layer. According to this example, the channel 213 of the first transistor 210 is p-doped and the channel 223 of the second transistors 220 is lightly n-doped.

In the arrangement shown in FIG. 2, each of the first and second transistors 210, 220 is implemented as a so-called vertical semiconductor device. Source portions 221 may be disposed adjacent to the first surface 251 of the semiconductor substrate 250. Gate trenches are disposed in the first surface 251 of the semiconductor substrate 250. The gate electrode 224 is disposed within the gate trenches, the gate electrode 224 being insulated from the adjacent body region 254 by a gate dielectric material 225. The channel region 223 is disposed adjacent to the gate electrode 224. The body region 254 of the second transistors 220 comprises the second channels 223 and, thus, has the same conductivity type as the source and drain regions 221, 222. For example, portions of the body region 254 are disposed adjacent to the second drift zone 240.

When being switched on, for example, by applying a positive gate voltage an inversion layer is formed at the boundary between the first channel region 213 and the gate dielectric material 215. Accordingly, the transistor 210 is in a conducting state from the first source region 211 to the first drain region 212 via the first drift zone 241. In case of switching off, no inversion layer is formed and the transistor 210 is not in a conducting state.

Further, when a positive or zero voltage is applied to the second gate electrode 224, an accumulation layer may be formed at the boundary between the second channel region 223 and the second gate dielectric material 225. Accordingly, with a positive or zero gate voltage being applied, the second transistors 220 are in a conducting state from the first source region 221 to the second drain region 222. In case of switching-off, the second transistors 220 are set in a non-conductive state. Hence, by an appropriate circuit design, when the first transistor is in an on-state, the second transistors will be set in an on-state, thereby decreasing the on resistance. When the first transistor 210 is in an off-state, the second transistors 220 will be set in an off-state, thereby increasing the breakdown voltage.

As is shown in FIG. 2, the series of the first transistor 210 and the plurality of second transistors 220 is formed adjacent to a first surface 251 of the semiconductor substrate 250. Further, each of the first and the second drain regions 212, 222 are formed as a buried layer within the semiconductor substrate 250. Accordingly, each of the first and second transistors 210, 220 are implemented as vertical devices. As a consequence, the product of $R_{on} \times$Area of the semiconductor device can further be improved. Moreover, due to the arrangement shown in FIG. 2, the whole area beneath the sequence of transistors may be used as a drift zone 219, whereby the breakdown voltage is further increased. In other words, the semiconductor device comprises a series connection of a first transistor and of a plurality of second transistors according to which, when the first transistor is in an on-state, the second transistors are in an on-state and when the first transistor is in an off-state, the second transistors are in an off-state. Additionally, the first and the second transistors are implemented as vertical power devices. As a consequence, the resulting semiconductor device has improved characteristics.

In summary, the embodiment shown in FIG. 2 relates to a semiconductor device, comprising a first transistor with a first drift zone, and a plurality of second transistors, each second transistor comprising a source region, a drain region and a gate electrode, wherein the second transistors are electrically coupled in series to form a series circuit that is electrically coupled to the first transistor, the first and the plurality of second transistors being at least partially disposed in a semiconductor substrate comprising a buried doped layer, wherein the source or the drain regions of the second transistors are disposed in the buried doped layer. Each of the second transistors comprises at least two transistor cells that are connected in parallel. The gate electrode of each of the transistor cells forming part of the second transistors is disposed in a gate trench that is disposed within a surface of the semiconductor substrate. The distance between adjacent gate trenches is less than 2×Wm, Wm being defined by the formula given above.

Figure 3A:
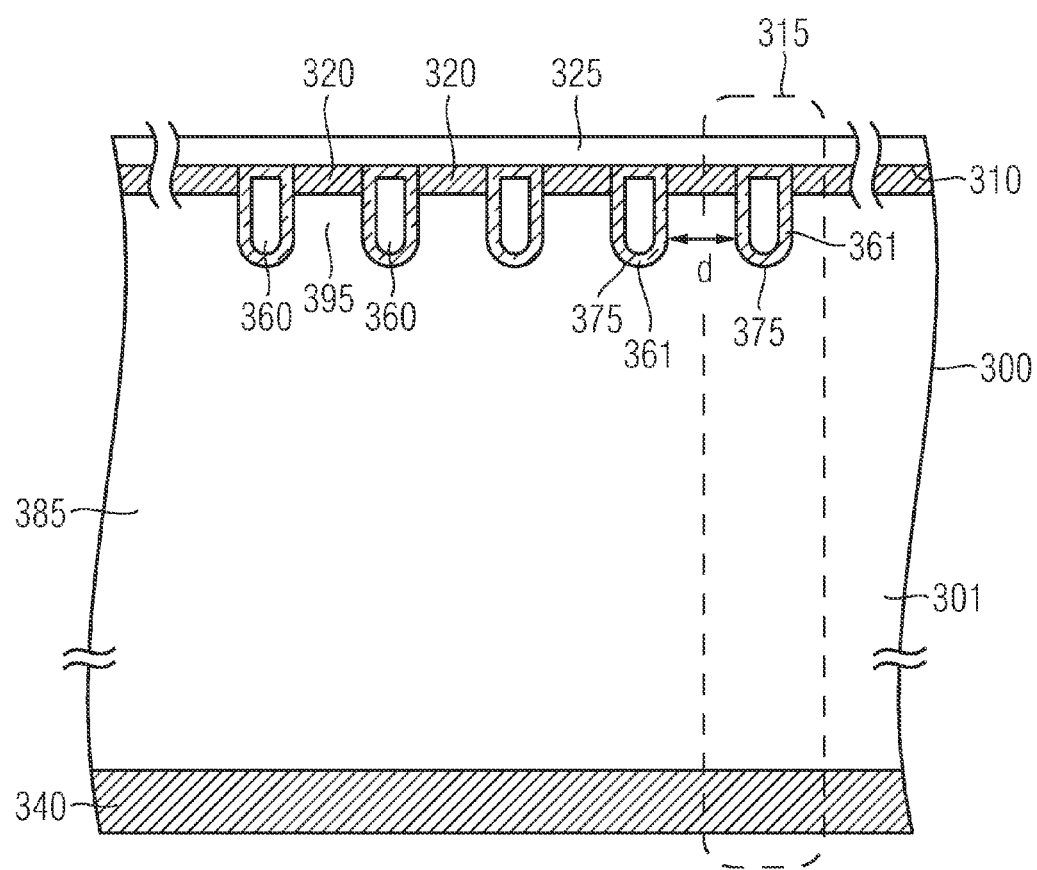

FIG. 3A shows a further embodiment. The semiconductor device 300 shown in FIG. 3A comprises a plurality of transistor cells 315, each of the transistor cells 315 comprising a source region 320, a drain region 340, and a gate electrode 360 disposed in a trench 375 that is arranged in a top surface 310 of a semiconductor substrate 301. The gate electrodes 360 of the different transistor cells 315 are electrically coupled to each other, the source regions 320 of the different transistor cells 315 are electrically coupled to each other, and the drain regions 340 of the different transistor cells 315 are electrically coupled to each other. Accordingly, the transistor cells 315 are electrically coupled in parallel. A lateral distance d between the trenches 375 is equal to or less than twice the length of a width of a depletion zone formed in the semiconductor body 395 adjacent to the gate electrodes 360, when a gate voltage corresponding to a threshold voltage of the transistor is applied to the gate electrodes 360. For example, the distance d between the trenches may be 120 nm or less, for example, 100 nm or less. For example, the distance d between the trenches 375 may be between 18 and 120 nm.

For example, the gate electrodes 360 may be insulated from the adjacent semiconductor material 301 by a gate dielectric 361. The source regions 320 may be electrically coupled by means of a conductive material 325. Each of the transistor cells 315 further comprises a drift zone 385 that is disposed between the semiconductor body 395 and the drain region 340. The source region 320 is disposed adjacent to the top surface 310 of the semiconductor substrate 301, and the drain region 340 is disposed at the back side of the semiconductor substrate 301.

According to the embodiment shown in FIG. 3B, the plurality of transistor cells 315 comprise first and second transistor cells 316, 317. The first transistor cells 316 comprise a first gate electrode 365, and the second transistor cells 317 comprise a second gate electrode 370. The first and the second gate electrodes 365, 370 are different from each other. For example, the first gate electrode 365 is disposed in a first trench 376 and the second gate electrode 370 is disposed in a second trench 377, and the first trench 376 may have first dimensions different from second dimensions of the second trench 377. For example, the first trench 376 may extend to a greater depth t1 than the depth t2 of the second trench 377. In addition or alternatively, the first trench 376 may have a width w1 that is different from a width w2 of the second trench 377. Still further, the cross-sectional shape of the first trench 376 may be different from the cross-sectional shape of the second trench 377. The difference between the first and second gate electrodes 365, 370 or between the first and second trenches 376, 377 is not due to deviations that may be caused by the gate electrode or trench manufacture which relates to an unintended deviation. Rather, this difference is caused by different manufacturing conditions that are employed for the first and second gate electrodes 365, 370 or for the first and second trenches 376, 377.

According to a further embodiment, a field plate may be disposed in the first trench 376, and no field plate is disposed in the second trench 377. An example of a field plate 80 is shown in FIGS. 1A and 1B. For example, the field plate may be electrically coupled to the first gate electrode 365 or may be insulated and may be held at a different potential.

Figure 4A:
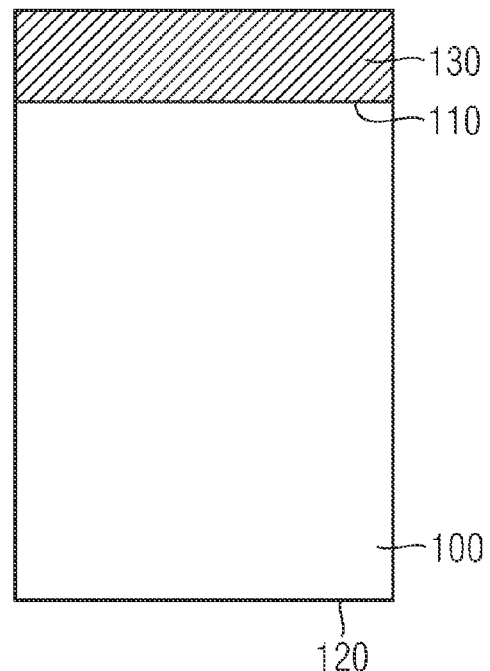
FIG. 4A to 4F illustrate cross-sectional views of the semiconductor device according to different processing stages when manufacturing the semiconductor device according to an embodiment.
Figure 4B:
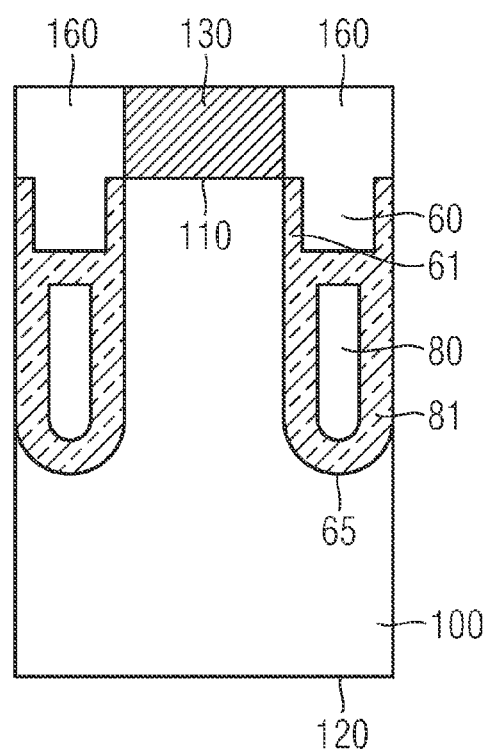

FIG. 4A to 4F illustrate cross-sectional views of a semiconductor substrate 100 when manufacturing the semiconductor device 90. For example, an n-doped silicon wafer may be the starting material of the semiconductor device. Nevertheless, it is clearly to be understood that the employed doping types may be reversed. On the surface 110 of the semiconductor substrate 100, a silicon nitride (SiN) layer 130 is formed. The SiN layer 130 acts as a hard mask during the following processing steps. Reference numeral 120 denotes a back side of the semiconductor substrate 100. Thereafter, standard processing steps are performed in order to manufacture a vertical MOSFET including a gate electrode that is disposed in a trench formed in the substrate surface 110. In particular, trenches 65 are etched into the semiconductor substrate 110. An insulating material 81, 61 is formed on the sidewalls of the trenches and the trenches are filled with a conductive material 80, 60. For example, the conductive material 60, 80 may be polysilicon and the insulating material may be silicon oxide. For example, the conductive material 60 forms the gate electrode and the conductive material 80 forms the field plate of the resulting power MOSFET devices. After the processing, the polysilicon material 160 on top of the semiconductor substrate is not etched back. As a result, as is shown in FIG. 4B, stripes of silicon nitride material 130 and of polysilicon material 160 are disposed over the substrate surface, the stripes of polysilicon material 160 and of silicon nitride 130 forming the surface of the resulting structure.

Figure 4C:
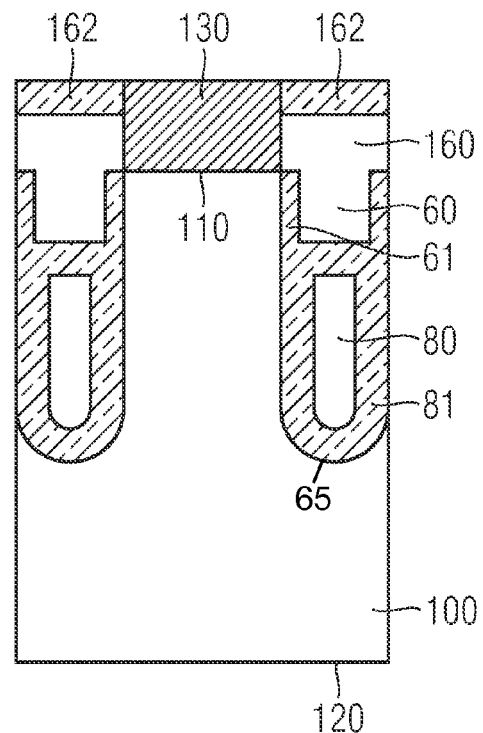

Thereafter, an oxidation step is performed so that silicon oxide is formed at the surface of the polysilicon filling 160. As a result, stripes of silicon oxide 162 and stripes of the silicon nitride hard mask layer 130 form the surface of the resulting structure, as is shown in FIG. 4C.

The silicon nitride layer 130 is removed from the substrate surface 110 and the polysilicon filling 160 forms a protruding portion. For example, this may be accomplished by etching in hot phosphoric acid. Then, a further silicon nitride layer is deposited by common processes. The thickness of the silicon nitride layer 140 is chosen in dependence from the desired width of the trenches 150 which are to be formed in a later processing step. After depositing the silicon nitride layer 140, a spacer etching process is performed. For example, due to the spacer etching process, the silicon nitride layer is etched in the horizontal direction at a higher etching rate than in the vertical direction. As a result, spacers 140 are formed at the sidewalls of the polysilicon material. Due to the special processing, the spacers 140 which are disposed on the left-hand side and on the right-hand side of each of the polysilicon plugs 160 will have the same width when being measured in a horizontal direction.

Figure 4D:
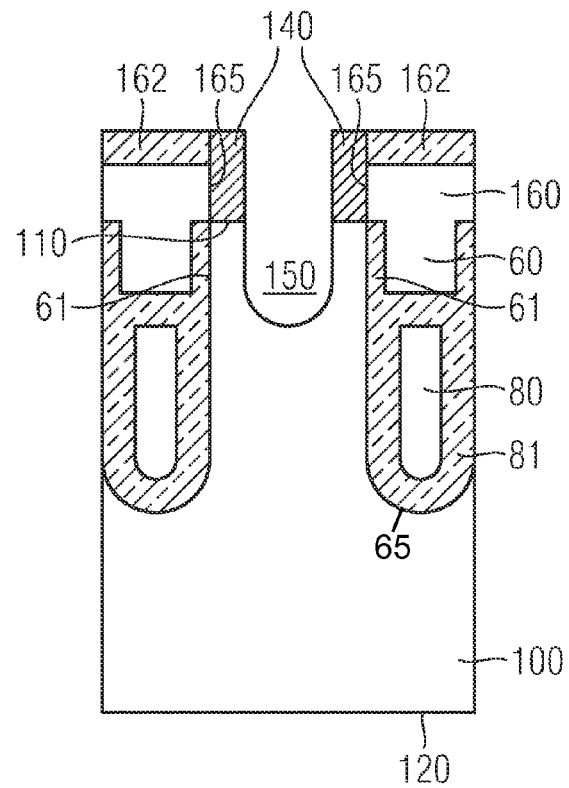

Thereafter, using the silicon nitride spacers 140 and the silicon oxide material 162 as an etching mask, trenches 150 are etched in the substrate surface 110. For example, the trenches 150 may be etched to extend to a greater depth than the gate electrodes 60 that are already formed in the semiconductor substrate 100. FIG. 4D shows an example of a resulting structure.

Figure 4E:
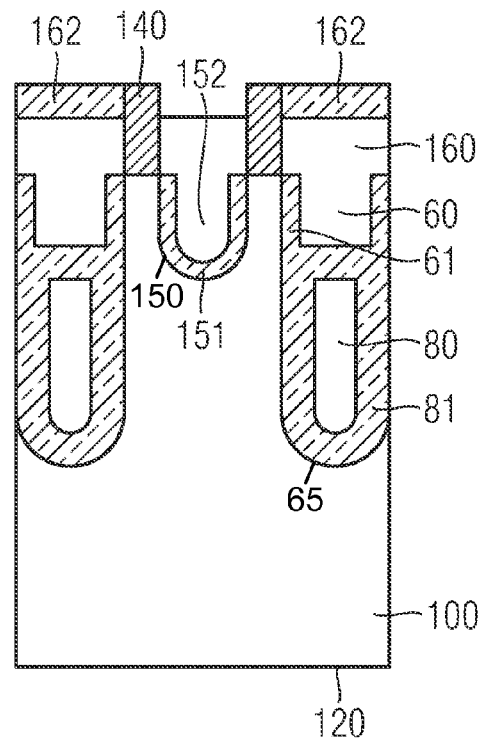

Then, an oxidation step is performed so as to form a gate oxide layer 151 along the sidewalls of the trenches 150. In a following step, a conductive material such as polysilicon 152 is filled in the trenches 150, followed by a recess etching step so that the surface of the polysilicon material 152 is at the same height as the surface of the polysilicon material 160. FIG. 4E shows an example of a resulting structure.

Figure 4F:
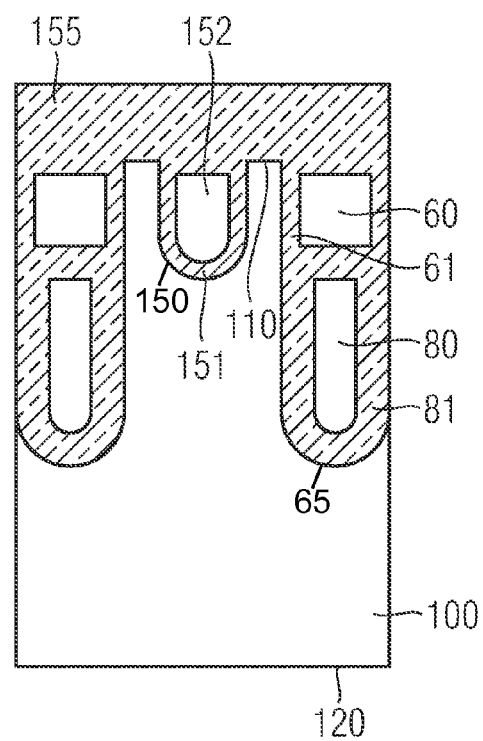

Thereafter, the silicon oxide material 162 is removed from the surface of the polysilicon material 160 and the silicon nitride spacers 140 are etched by known processes. In a next step, a silicon oxide layer 155 is deposited. As a result, as is shown in FIG. 4F, the surface of the semiconductor substrate 100 is covered by the silicon oxide layer 155.

Due to the use of the silicon nitride spacer layer, the trenches 150 are disposed in a self-aligned manner with respect to the trenches 65 in which the gate electrode 60 is present, even when the gate electrodes 60 are disposed at small pitches of 40 to 200 nm. Accordingly, the trenches 150 are disposed at the center of the distance between the trenches 65 in which the gate electrode 60 is present. Further, the width of the semiconductor material on the right hand side is equal to the width of the semiconductor material on the left-hand side of the trenches 150. As is clearly to be understood, instead of silicon nitride material, any other suitable sacrificial material can be used for forming the spacer 140. Then, contacts and metallization layers and lines may be formed as is conventional.

Figure 5A:
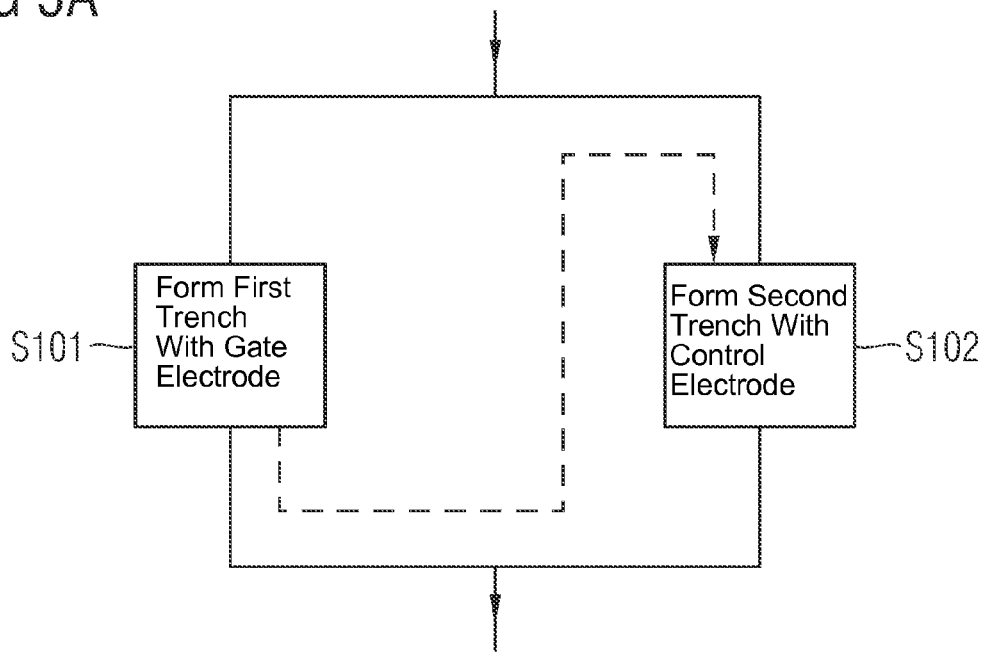
FIGS. 5A and 5B schematically illustrate methods of manufacturing a semiconductor device.

FIG. 5A schematically illustrates a method of manufacturing a semiconductor device according to an embodiment. As is shown, a method of manufacturing a semiconductor device comprises forming a transistor by forming a source region, a drain region, a gate electrode, forming the gate electrode by forming a first trench (S 101) in a top surface of the semiconductor substrate, and forming a control electrode, forming the control electrode comprising forming a second trench (S102) in the top surface of the semiconductor substrate.

Figure 5B:
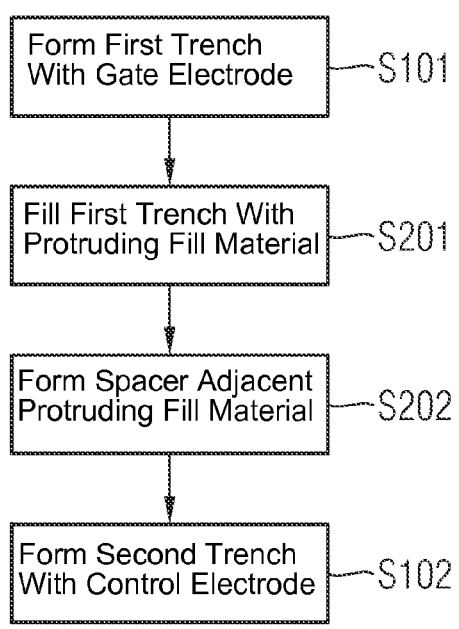

According to an embodiment, forming the second trench (S 102) is performed after forming the first trenches (S 101). According to a further embodiment, the second trenches 150 are formed in a self-aligned manner with respect to the positions of the first trenches 65. For example, this may be accomplished by filling a fill material (S 201) in the first trench 65 so that fill material protrudes from the top surface 110 of the semiconductor substrate 100, the protruding fill material 160 having sidewalls 165. For example, the fill material may be conductive material for forming the gate electrode. Alternatively, the fill material may be an arbitrary sacrificial material. Thereafter, a spacer of a further sacrificial material may be formed (S 202) adjacent to the sidewalls 165 of the protruding fill material 160. FIG. 5B illustrates an embodiment of this method.

According to an embodiment, second trenches 150 are etched (S 102) in the top surface of the semiconductor substrate 100, using the protruding fill material 160 and the spacer 140 as an etching mask. Then, the semiconductor device is further processed according to known processing methods.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising:
   a first transistor at least partially formed in a semiconductor substrate, the first transistor comprising a first drift zone; and
   a plurality of second transistors connected in series to form a series circuit, the series circuit being connected in series with the first transistor to form a further series circuit, the further series circuit implementing an active drift zone field effect transistor, at least one of the second transistors comprising:
   a plurality of trenches in a top surface of the semiconductor substrate; and
   a plurality of transistor cells, each of the transistor cells comprising a second gate electrode, the second gate electrodes being disposed in the trenches;
   wherein the second gate electrodes of different transistor cells are electrically coupled to each other, second source regions of different transistor cells are electrically coupled to each other, and second drain regions of different transistor cells are electrically coupled to each other;
   wherein a lateral distance between the trenches is such that, depending on a doping impurity concentration of a body region, the body region between adjacent inversion layers formed at a boundary between the body region and a gate dielectric material at the second gate electrodes is completely depleted responsive to a voltage corresponding to at least a threshold voltage of the second transistor being applied to the second gate electrode; and wherein the semiconductor substrate comprises a buried doped layer, the second source regions or the second drain regions of the second transistor cells being disposed in the buried doped layer.

2. The semiconductor device according to claim 1, wherein a lateral distance between adjacent trenches is less than 120 nm.

3. The semiconductor device according to claim 1, wherein the first transistor and the plurality of second transistors are disposed adjacent to the top surface of the semiconductor substrate.

4. The semiconductor device according to claim 1, wherein adjacent ones of the second transistors are connected by means of second contact trenches formed in the top surface of the semiconductor substrate and transistor interconnects.

5. The semiconductor device according to claim 4, wherein the transistor interconnects are disposed over the top surface of the semiconductor substrate.

6. The semiconductor device according to claim 1, wherein the first transistor further comprises a first drain region, the first drain region and the second drain regions being arranged in the buried layer.

7. A semiconductor device comprising:
 a first transistor comprising a first drift zone; and
 a plurality of second transistors connected in series to form a series circuit, the series circuit being connected in series with the first transistor to form a further series circuit, the further series circuit implementing an active drift zone field effect transistor,
 the first transistor and the plurality of second transistor being formed in a semiconductor substrate comprising a buried layer,
 each of the second transistors comprising:
 transistor cells connected in parallel, each of the transistor cells comprising a second gate electrode, the second gate electrodes being disposed in gate trenches arranged in a top surface of the semiconductor substrate, second source regions or second drain regions of the transistor cells being arranged in the buried layer,
 wherein a lateral distance d between the gate trenches fulfills the following formula:

$d < 2 \times Wm,$ wherein Wm denotes a maximum width of a surface depletion region formed in the semiconductor substrate.

8. The semiconductor device according to claim 7, wherein a lateral distance between adjacent trenches is less than 120 nm.

9. The semiconductor device according to claim 7, wherein the first transistor and the plurality of second transistors are disposed adjacent to the top surface of the semiconductor substrate.

10. The semiconductor device according to claim 7, wherein adjacent ones of the second transistors are connected by means of second contact trenches formed in the top surface of the semiconductor substrate and transistor interconnects.

11. The semiconductor device according to claim 10, wherein the transistor interconnects are disposed over the top surface of the semiconductor substrate.

* * * * *

UNITED STATES PATENT AND TRADEMARK OFFICE
CERTIFICATE OF CORRECTION

PATENT NO. : 9,941,403 B2
APPLICATION NO. : 13/627215
DATED : April 10, 2018
INVENTOR(S) : T. Schloesser et al.

It is certified that error appears in the above-identified patent and that said Letters Patent is hereby corrected as shown below:

Column 14, Line 3 (Claim 7, Line 8) please change "second transistor" to -- second transistors --

Signed and Sealed this
Tenth Day of July, 2018

Andrei Iancu
*Director of the United States Patent and Trademark Office*